US007813651B2

(12) United States Patent
Ilchenko et al.

(10) Patent No.: US 7,813,651 B2
(45) Date of Patent: Oct. 12, 2010

(54) TUNABLE RADIO FREQUENCY AND MICROWAVE PHOTONIC FILTERS

(75) Inventors: Vladimir Ilchenko, Arcadia, CA (US); Lutfollah Maleki, Pasadena, CA (US)

(73) Assignee: OEWaves, Inc., Pasadena, CA (US)

( * ) Notice: Subject to any disclaimer, the term of this patent is extended or adjusted under 35 U.S.C. 154(b) by 0 days.

(21) Appl. No.: 12/555,790

(22) Filed: Sep. 8, 2009

(65) Prior Publication Data

US 2009/0324251 A1 Dec. 31, 2009

Related U.S. Application Data

(62) Division of application No. 11/034,232, filed on Jan. 11, 2005, now Pat. No. 7,587,144.

(60) Provisional application No. 60/535,953, filed on Jan. 12, 2004, provisional application No. 60/609,450, filed on Sep. 13, 2004.

(51) Int. Cl.
*H04B 10/04* (2006.01)
(52) U.S. Cl. .................... 398/183; 398/115; 398/187
(58) Field of Classification Search ............. 398/85–87, 398/115, 142, 182–188, 198
See application file for complete search history.

(56) References Cited

U.S. PATENT DOCUMENTS

| 5,204,640 A | 4/1993 | Logan, Jr. |
| 5,220,292 A | 6/1993 | Bianchini et al. |
| 5,267,072 A | 11/1993 | Maleki |
| 5,723,856 A | 3/1998 | Yao et al. |
| 5,751,747 A | 5/1998 | Lutes et al. |
| 5,777,778 A | 7/1998 | Yao |
| 5,917,179 A | 6/1999 | Yao |
| 5,929,430 A | 7/1999 | Yao et al. |
| 5,985,166 A | 11/1999 | Unger et al. |
| 6,080,586 A | 6/2000 | Baldeschwieler et al. |

(Continued)

FOREIGN PATENT DOCUMENTS

WO     01/96936     12/2001

(Continued)

OTHER PUBLICATIONS

Braginsky, V.B., et al., "Quality-Factor and Nonlinear Properties of Optical Whispering-Gallery Modes," *Physics Letters A*, 137(7, 8):393-397, May 1989.

(Continued)

*Primary Examiner*—Dzung D Tran
(74) *Attorney, Agent, or Firm*—Perkins Coie LLP

(57) ABSTRACT

RF and microwave devices and techniques are disclosed for processing RF and microwave signals by using (1) photonic or optical components and (2) RF and microwave components. In some implementations, a part of the processing is performed in the RF and microwave domain such as applying a microwave or RF input signal to control an optical modulator, and another part of the processing is performed in the optical domain such as optical filtering of the modulated optical beam to select desired microwave or RF spectral components. The frequency of a selected spectral component can be tuned by either tuning the frequency of the optical beam that is modulated by the optical modulator or a filter that is used to filter modulated optical beam.

10 Claims, 12 Drawing Sheets

U.S. PATENT DOCUMENTS

| | | |
|---|---|---|
| 6,178,036 B1 | 1/2001 | Yao |
| 6,203,660 B1 | 3/2001 | Unger et al. |
| 6,389,197 B1 | 5/2002 | Iltchenko et al. |
| 6,417,957 B1 | 7/2002 | Yao |
| 6,473,218 B1 | 10/2002 | Maleki et al. |
| 6,476,959 B2 | 11/2002 | Yao |
| 6,487,233 B2 | 11/2002 | Maleki et al. |
| 6,488,861 B2 | 12/2002 | Iltchenko et al. |
| 6,490,039 B2 | 12/2002 | Maleki et al. |
| 6,535,328 B2 | 3/2003 | Yao |
| 6,567,436 B1 | 5/2003 | Yao et al. |
| 6,580,532 B1 | 6/2003 | Yao et al. |
| 6,594,061 B2 | 7/2003 | Huang et al. |
| 6,762,869 B2 | 7/2004 | Maleki et al. |
| 6,795,481 B2 | 9/2004 | Maleki et al. |
| 6,798,947 B2 | 9/2004 | Iltchenko |
| 6,853,479 B1 | 2/2005 | Ilchenko et al. |
| 6,871,025 B2 | 3/2005 | Maleki et al. |
| 6,873,631 B2 | 3/2005 | Yao et al. |
| 6,879,752 B1 | 4/2005 | Ilchenko et al. |
| 6,901,189 B1 | 5/2005 | Savchenkov et al. |
| 6,906,309 B2 | 6/2005 | Sayyah et al. |
| 6,922,497 B1 | 7/2005 | Savchenkov et al. |
| 6,928,091 B1 | 8/2005 | Maleki et al. |
| 6,943,934 B1 | 9/2005 | Ilchenko et al. |
| 6,987,914 B2 | 1/2006 | Savchenkov et al. |
| 7,024,069 B2 | 4/2006 | Savchenkov et al. |
| 7,043,117 B2 | 5/2006 | Matsko et al. |
| 7,050,212 B2 | 5/2006 | Matsko et al. |
| 7,061,335 B2 | 6/2006 | Maleki et al. |
| 7,062,131 B2 | 6/2006 | Ilchenko |
| 7,092,591 B2 | 8/2006 | Savchenkov et al. |
| 7,133,180 B2 | 11/2006 | Ilchenko et al. |
| 7,173,749 B2 | 2/2007 | Maleki et al. |
| 7,184,451 B2 | 2/2007 | Ilchenko et al. |
| 7,187,870 B2 | 3/2007 | Ilchenko et al. |
| 7,218,662 B1 | 5/2007 | Ilchenko et al. |
| 7,248,763 B1 | 7/2007 | Kossakovski et al. |
| 7,260,279 B2 | 8/2007 | Gunn et al. |
| 7,283,707 B1 | 10/2007 | Maleki et al. |
| 7,362,927 B1 | 4/2008 | Ilchenko et al. |
| 7,369,722 B2 | 5/2008 | Yilmaz et al. |
| 7,373,088 B2 * | 5/2008 | Yap et al. .................... 398/183 |
| 7,389,053 B1 | 6/2008 | Ilchenko et al. |
| 7,400,796 B1 | 7/2008 | Kossakovski et al. |
| 7,440,651 B1 | 10/2008 | Savchenkov et al. |
| 7,460,746 B2 | 12/2008 | Maleki et al. |
| 2001/0038651 A1 | 11/2001 | Maleki et al. |
| 2002/0018611 A1 * | 2/2002 | Maleki et al. .................. 385/15 |
| 2002/0018617 A1 | 2/2002 | Iltchenko et al. |
| 2002/0021765 A1 | 2/2002 | Maleki et al. |
| 2002/0081055 A1 | 6/2002 | Painter et al. |
| 2002/0085266 A1 | 7/2002 | Yao |
| 2002/0097401 A1 | 7/2002 | Maleki et al. |
| 2002/0131662 A1 | 9/2002 | Strutz et al. |
| 2003/0012504 A1 | 1/2003 | Iltchenko |
| 2003/0068131 A1 | 4/2003 | Gunn, III |
| 2003/0160148 A1 * | 8/2003 | Yao et al. .................... 250/205 |
| 2004/0100675 A1 | 5/2004 | Matsko et al. |
| 2004/0109217 A1 | 6/2004 | Maleki et al. |
| 2004/0218880 A1 | 11/2004 | Matsko et al. |
| 2004/0240781 A1 | 12/2004 | Savchenkov et al. |
| 2005/0017816 A1 | 1/2005 | Ilchenko et al. |
| 2005/0063034 A1 | 3/2005 | Maleki et al. |
| 2005/0074200 A1 | 4/2005 | Savchenkov et al. |
| 2005/0123306 A1 | 6/2005 | Ilchenko et al. |
| 2005/0128566 A1 | 6/2005 | Savchenkov et al. |
| 2005/0185681 A1 | 8/2005 | Ilchenko et al. |
| 2005/0248823 A1 | 11/2005 | Maleki et al. |
| 2007/0009205 A1 | 1/2007 | Maleki et al. |
| 2007/0153289 A1 | 7/2007 | Yilmaz et al. |
| 2008/0001062 A1 | 1/2008 | Gunn et al. |
| 2008/0075464 A1 | 3/2008 | Maleki et al. |
| 2008/0310463 A1 | 12/2008 | Maleki et al. |

FOREIGN PATENT DOCUMENTS

| | | |
|---|---|---|
| WO | 2005/038513 | 4/2005 |
| WO | 2005/055412 | 6/2005 |
| WO | 2005/067690 | 7/2005 |
| WO | 2005/122346 | 12/2005 |
| WO | 2006/076585 | 7/2006 |
| WO | 2007/143627 | 12/2007 |

OTHER PUBLICATIONS

Eliyahu, D., et al., "Low Phase Noise and Spurious Levels in Multi-Loop Opto-Electronic Oscillators," *Proceedings of the 2003 IEEE International Frequency Control Sympsoium and PDA Exhibition*, pp. 405-410, May 2003.

Eliyahu, D., et al., "Modulation Response ($S_{21}$) of the Coupled Opto-Electronic Oscillator," *Proceedings of the 2005 IEEE International Frequency Control Symposium and Exposition*, pp. 850-856, Aug. 2005.

Eliyahu, D., et al., "Tunable, Ultra-Low Phase Noise YIG Based Opto-Electronic Oscillator," *IEEE MTT-S International Microwave Symposium Digest*, 3:2185-2187, Jun. 2003.

Gorodetsky, M.L., et al., "Optical Microsphere Resonators: Optimal Coupling to High-$Q$ Whispering-Gallery Modes," *J.Opt. Soc. Am. B*, 16(1):147-154, Jan. 1999.

Gorodetsky, M.L., et al., "Rayleigh Scattering in High-$Q$ Microspheres," *J. Opt. Soc. Am. B*, 17(6):1051-1057, Jun. 2000.

Gorodetsky, M.L., et al., "Ultimate $Q$ of Optical Microsphere Resonators," *Optics Letters*, 21(7):453-455, Apr. 1996.

Hryniewicz, J.V., et al., "Higher Order Filter Response in Coupled Microring Resonators," *IEEE Photonics Technology Letters*, 12(3):320-322, Mar. 2000.

Huang, S., et al., "A 'Turnkey' Optoelectronic Oscillator with Low Acceleration Sensitivity," *2000 IEEE/EIA International Frequency Control Symposium and Exhibition*, pp. 269-279, Jun. 2000.

Ilchenko, V., et al., "Electrooptically Tunable Photonic Microresonators and Photonic Bandgap Waveguide Coupling for Micro-Optoelectronic Oscillators," *GOMACTech 2003*, Tampa, Florida, pp. 1-4.

Ilchenko, V., et al., "High-Q Microsphere Cavity for Laser Stabilization and Optoelectronic Microwave Oscillator," *Proceedings SPIE Microresonators and Whispering-Gallery Modes*, vol. 3611, pp. 190-198, Jan. 1999.

Ilchenko, V., et al., "Microsphere Integration in Active and Passive Photonics Devices," *Proc. of SPIE Laser Resonators III*, vol. 3930, pp. 154-162, Jan. 2000.

Ilchenko, V., et al., "Microtorus: A High-Finesse Microcavity with Whispering-Gallery Modes," *Optics Letters*, 26(5):256-258, Mar. 2001.

Ilchenko, V. et al., "Pigtailing the High-$Q$ Microsphere Cavity: A Simple Fiber Coupler for Optical Whispering-Gallery Modes," *Optics Letters*, 24(11):723-725, Jun. 1999.

Ilchenko, V., et al., "Sub-Micro Watt Photonic Microwave Receiver," *IEEE Photonics Technology Letters*, 14(11):1602-1604, Nov. 2002.

Ilchenko, V., et al., "Tunability and Synthetic Lineshapes in High-Q Optical Whispering Gallery Modes," *Proc. of SPIE Laser Resonators and Beam Control VI*, vol. 4969, pp. 195-206, Jan. 2003.

Ilchenko, V., et al., "Whispering-Gallery-Mode Electro-Optic Modulator and Photonic Microwave Receiver," *J. Opt. Soc. Am. B*, 20(2):333-342, Feb. 2003.

Ito, H. et al., "InP/InGaAs Uni-Travelling-Carrier Photodiode with 310 GHz Bandwidth," *Electronics Letters*, 36(21):1809-1810, Oct. 2000.

Ji, Y., et al., "Compact Optoelectronic Oscillator with Ultra-Low Phase Noise Performance," *Electronics Letters*, 35(18):1554-1555, Sep. 1999.

Logan, R., et al., "Stabilization of Oscillator Phase Using a Fiber-Optic Delay-Line," *IEEE 45th Annual Symposium on Frequency Control*, pp. 508-512, May 1991.

Maleki, L., "The Opto-Electronic Oscillator: Prospects for Extending the State of the Art in Reference Frequency Generation," *International Topical Meeting on Microwave Photonics*, pp. 195-198, Oct. 1998.

Matsko, A., et al., "Active Mode Locking with Whispering-Gallery Modes," *J. Opt. Soc. Am. B*, 20(11):2292-2296, Nov. 2003.

Matsko, A., et al., "Whispering-Gallery-Mode based Optoelectronic Microwave Oscillator," *Journal of Modern Optics*, 50(15-17):2523-2542, Feb. 2004.

Matsko, A. et al., "Whispering-Gallery-Mode Resonators as Frequency References. I. Fundamental Limitations," *J. Opt. Soc. Am. B*, 24(6):1324-1335, Jun. 2007.

Myers, L.E. et al., "Quasi-Phase-Matched Optical Parametric Oscillators in Bulk Periodically Poled $LiNbO_3$," *J. Opt. Soc. Am. B*, 12(11):2102-2116, Nov. 1995.

Savchenkov, A., et al., "Whispering-Gallery-Mode Resonators as Frequency References. II. Stabilization," *J. Opt. Soc. Am. B*, 24(12):2988-2997, Dec. 2007.

Vassiliev, V.V., et al., "Narrow-Line-Width Diode Laser with a High-$Q$ Microsphere Resonator," *Optics Communications*, 158(1-6):305-312, Dec. 1998.

Yao, X.S., et al., "A Novel Photonic Oscillator," *Digest of the LEOS Summer Topical Meetings*, pp. 17-18, Aug. 1995.

Yao, X.S., et al., "A Novel Photonic Oscillator," *TDA Progress Report 42-122*, pp. 32-43, Aug. 1995.

Yao, X.S., et al., "Converting Light into Spectrally Pure Microwave Oscillation," *Optics Letters*, 21(7):483-485, Apr. 1996.

Yao, X.S., et al., "Coupled Optoelectronic Oscillators for Generating Both RF Signal and Optical Pulses," *Journal of Lightwave Technology*, 18(1):73-78, Jan. 2000.

Yao, X.S., et al., "Dual Microwave and Optical Oscillator," *Optics Letters*, 22(24):1867-1869, Dec. 1997.

Yao, X.S., et al., "Multiloop Optoelectronic Oscillator," *IEEE Journal of Quantum Electronics*, 36(1):79-84, Jan. 2000.

Yao, X.S., et al., "Optoelectronic Microwave Oscillator," *J. Opt. Soc. Am. B*, 13(8):1725-1735, Aug. 1996.

Yao, X.S., et al., "Optoelectronic Oscillator for Photonic Systems," *IEEE Journal of Quantum Electronics*, 32(7):1141-1149, Jul. 1996.

Yu, J., et al., "Compact Optoelectronic Oscillator with Ultra-Low Phase Noise Performance," *Electronics Letters*, 35(18):1554-1555, Sep. 1999.

International Preliminary Report on Patentability dated May 27, 2008 for International Application No. PCT/US2005/000895, filed Jan. 12, 2005 (6 pages).

Office Action dated Mar. 18, 2010 for Canadian Patent Application No. 2,549,466 (4 pages).

\* cited by examiner

Optical Spectrum of Modulated Optical Beam 132

TUNABLE RADIO FREQUENCY AND MICROWAVE PHOTONIC FILTERS

This application is a divisional application of U.S. patent application Ser. No. 11/034,232, filed Jan. 11, 2005, now U.S. Pat. No. 7,587,144, which claims the benefits of the following U.S. Provisional Patent Applications:

No. 60/535,953 entitled "OPTO-ELECTRONIC TUNABLE MICROWAVE FILTER" and filed on Jan. 12, 2004; and No. 60/609,450 entitled "TUNABLE MICROWAVE PHOTONIC FILTER" and filed on Sep. 13, 2004.

The entire disclosures of the above two patent applications are incorporated herein by reference as part of the specification of this application.

BACKGROUND

This application relates to radio frequency (RF) and microwave devices and photonic devices.

Various applications require filtering of spectral components in signals by selecting one or more spectral components while rejecting other components. One example is bandpass filtering where a selected one or more spectral components within a spectral band are selected to transmit and spectral components outside the spectral band are rejected. A filter may be tunable, e.g., under a control of a tuning control signal, to change the frequency range of the filtered signal. As an example, a radio receiver has a tunable filter to select a desired radio station broadcast signal from many radio broadcast signals at different frequencies in the air. A television tuner is another example of such tunable filters. Many RF and microwave tunable filters are made of electronic RF and microwave circuit components.

SUMMARY

This application describes, among others, RF and microwave filters and filtering techniques for processing RF and microwave signals by using (1) photonic or optical components and (2) RF and microwave components. In some implementations, a part of the processing is performed in the RF and microwave domain such as applying a microwave or RF input signal to an optical modulator to control optical modulation of light, and another part of the processing is performed in the optical domain such as optical filtering of the modulated light to select one or more desired microwave or RF spectral components as the filtered output. The frequency of a selected spectral component can be tuned by either tuning the frequency of the light that is modulated by the optical modulator or an optical filter that is used to optically filter modulated optical beam.

In one implementation, a device described here includes an input port to receive an input microwave or RF signal, a laser to produce a continuous-wave laser beam, a first optical path to receive a first portion of the laser beam, and a second optical path to receive a second portion of the laser beam. The second optical path includes an optical modulator to modulate the second portion in response to the input signal to produce a modulated optical beam that carries the input signal, and a tunable optical filter to filter the modulated optical beam to select at least one spectral component in the input signal while rejecting other spectral components and to output a filtered modulated optical beam that carries the at least one selected spectral component. The tunable optical filter includes at least two optical resonators that are optically coupled to produce a filter function of at least a second order. A tuning control unit is provided in the device in this implementation to tune at least one of the two optical resonators to change a frequency of the at least one selected spectral component. In addition, an optical detector is provided to combine the first portion from the first optical path and the filtered modulated optical beam from the second optical path and to produce a filtered output signal comprising the at least one selected spectral component.

The device may use two whispering gallery mode (WGM) resonators as the two optical resonators which are tunable via an electro-optic effect. The tunable optical filter may include a third electro-optic whispering gallery mode resonator optically coupled to one of the two tunable optical resonators and tuned by the tuning control unit to effectuate a third order filter function in the tunable optical filter.

Alternatively, the tunable optical filter in the device may be implemented with a first optical waveguide optically coupled to the first and second optical resonators and to receive the modulated optical beam from the optical modulator, and a second, separate optical waveguide optically coupled to the first and second optical resonators to output the filtered modulated optical beam to the optical detector. The first and second optical resonators are directly optically coupled to each other in addition to optical coupling with each other via optical coupling to the first and second waveguides.

As another alternative, the tunable optical filter in the device may include a first optical waveguide optically coupled to the first and second optical resonators and to receive the modulated optical beam from the optical modulator and to output the filtered modulated optical beam to the optical detector, and a second, separate optical waveguide optically coupled to the first and second optical resonators. The first and second optical resonators are directly optically coupled to each other in addition to optical coupling with each other via optical coupling to the first and second waveguides.

Furthermore, the two optical resonators in the tunable optical filter of the device may be first and second optical resonators, respectively, and the tunable optical filter may further include third and fourth optical resonators. The first optical resonator receives the modulated optical beam from the optical modulator and the fourth optical resonator outputs the filtered modulated optical beam to the optical detector. The first, second, third and fourth optical resonators are optically coupled to one another in the following manner: the first optical resonator is optically coupled to the second and third optical resonators; the second optical resonator is further optically coupled to the fourth optical resonator; the third optical resonator is further optically coupled to the fourth optical resonator; and the second and third optical resonators are not directly coupled to each other and are indirectly coupled via the first and fourth optical resonators.

Other implementations described in this application perform the frequency tuning in the optical domain by tuning the frequency of the optical beam. For example, a method for filtering a signal includes applying a microwave or RF signal to an optical modulator to control optical modulation of an optical beam and to produce a modulated optical beam that carries the signal, optically filtering the modulated optical beam to reject undesired signal spectral bands in the modulated optical beam to produce a filtered optical beam that carries at least one selected signal spectral band, tuning a frequency of the optical beam to select the frequency of the at least one selected signal spectral band, combining a portion of the optical beam that is not modulated by the optical modulator and the filtered optical beam into a combined beam, and using an optical detector to convert the combined beam into a filtered microwave or RF signal that carries the at least one selected signal spectral band.

A device that implements the tuning of the frequency of the optical beam may include, for example, an input port to receive an input microwave or RF signal, a tunable laser to produce a continuous-wave laser beam and to tune a laser frequency of the laser beam, a first optical path to receive a first portion of the laser beam, a second optical path to receive a second portion of the laser beam, and a tuning control unit to tune the laser frequency of the tunable laser. The second optical path includes an optical modulator to modulate the second portion in response to the input signal to produce a modulated optical beam that carries the input signal, and an optical filter to filter the modulated optical beam to select at least one spectral component in the input signal while rejecting other spectral components and to output a filtered modulated optical beam that carries the at least one selected spectral component. Accordingly, the tuning control unit operates to tune the laser and thus change a frequency of the at least one selected spectral component. This device further includes an optical detector to combine the first portion from the first optical path and the filtered modulated optical beam from the second optical path and to produce a filtered output signal comprising the at least one selected spectral component.

In yet another implementation, a microwave or RF signal is applied to an optical modulator to control optical modulation of an optical beam and to produce a modulated optical beam that carries the signal. At least two cascaded optical resonators are used to optically filter the modulated optical beam to reject undesired signal spectral bands in the modulated optical beam to produce a filtered optical beam that carries at least one selected signal spectral band. A frequency of one of the two cascaded optical resonators is tuned to select the frequency of the at least one selected signal spectral band. A portion of the optical beam that is not modulated by the optical modulator and the filtered optical beam are combined into a combined beam. An optical detector is used to convert the combined beam into a filtered microwave or RF signal that carries the at least one selected signal spectral band.

These and other implementations, features, and associated various advantages are described in greater detail in the drawings, the detailed description, and the claims.

DETAILED DESCRIPTION

Tunable filters and filtering techniques described in this application use an input port to receive a non-optical input signal to be filtered, e.g., a microwave or RF signal, and an output port to export a filtered or processed non-optical signal, e.g., a filtered microwave or RF signal. The input signal is converted into optical domain via optical modulation of a continuous-wave optical beam and the modulated optical beam is then optically filtered to select desired microwave or RF spectral components. An optical filter with a high quality factor can produce ultra narrow linewidth to optically select one or more desired microwave or RF spectral components carried in the modulated optical beam. Such optical filtering of microwave or RF spectral components avoids use of microwave or RF filters that tend to suffer a number of limitations imposed by the electronic microwave or RF circuit elements. The filtered optical signal and a portion of the same continuous-wave optical beam are combined and sent into an optical detector. The output of the optical detector is used as the filtered or processed non-optical signal. Like the signal filtering, the frequency tuning of the filtering in these implementations is also achieved optically, e.g., by either tuning the frequency of the optical beam that is modulated by the optical modulator or an optical filter that is used to filter modulated optical beam.

Figure 1A:
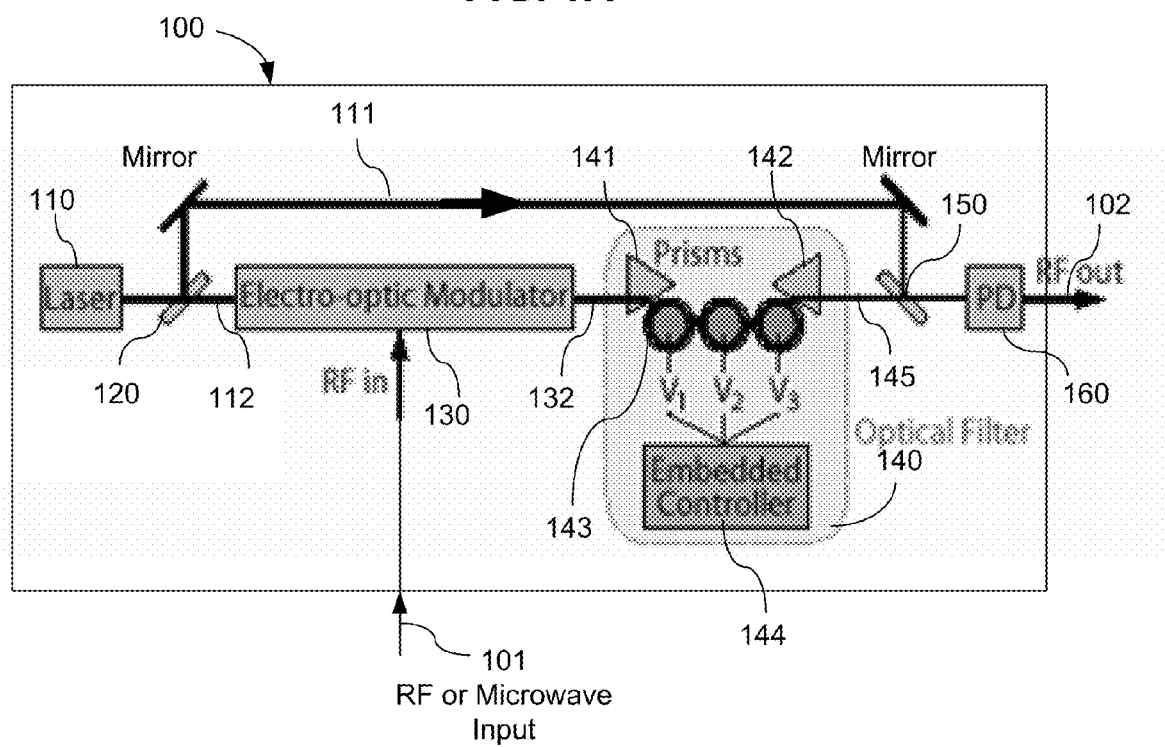
FIG. 1A shows one example of a tunable RF or microwave filter that uses a tunable optical filter for filtering and tuning the output RF or microwave signal.

FIG. 1A shows one example of a tunable microwave or RF filter 100 based on optical filtering and tuning. The filter 100 receives an input microwave or RF signal 101 and produces a filtered output microwave or RF signal 102 with one or more spectral components selected from the input spectral components in the input signal 101. Inside the filter 100, a laser 100, e.g., a diode laser, is used to produce a continuous-wave laser beam. An optical beam splitter or coupler 120 splits the laser beam into a first beam 111 along a first optical path and a second beam 112 along a second, separate optical path. An optical beam combiner 150 is used to combine the light beams from the two optical paths into a combined optical beam. An optical detector 160 receives and converts the combined beam into the filtered microwave or RF signal 102. The two optical paths formed by the beam splitter 120 and the beam combiner 150 create an interferometer: the upper first optical path serves as a reference while the filtering takes place in the lower second optical path. The upper first optical path may include an optical delay element to produce a delay that compensates for the group delay caused by the optical filter 140 in the lower second optical path.

In this specific implementation, the optical filtering and tuning of the output signal 102 are performed in the lower second optical path. The input RF or microwave signal 101 is first up-converted into the optical domain using a broadband modulator. The signal filtering is done in optical domain using a tunable high-Q optical filter. The signal tuning is also done in the optical domain by tuning the optical filter to select one or more spectral components. In the lower second optical path, an optical modulator 130, such as an electro-optic modulator, is used to modulate the second optical beam 112 in response to the input signal 101. This optical modulation produces a modulated optical beam 132 that carries the microwave or RF spectral components in the input signal 101. The operating bandwidth of the optical modulator 130 is designed to be sufficiently broad to cover the signal frequencies of the input signal 101. The microwave or RF spectral components in the input signal 101 appear as optical sidebands at different optical frequencies from the laser frequency of the laser 110. This process converts the microwave or RF spectral components into the optical domain. Therefore, signal filtering and frequency tuning can be performed optically.

Figure 1B:
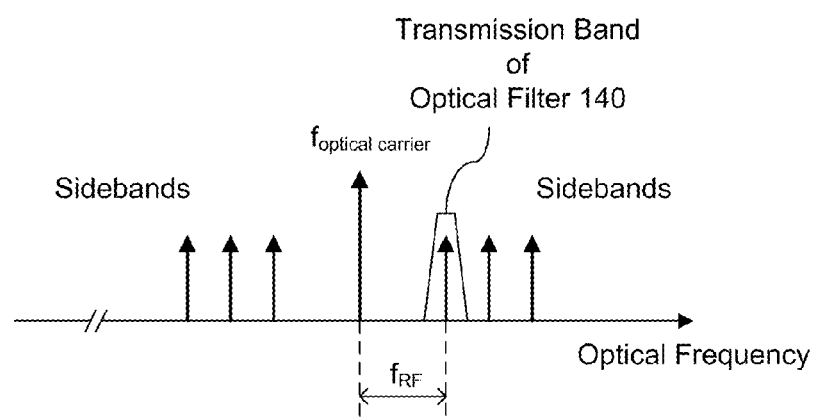
FIG. 1B is a chart illustrating an example of the spectrum of a modulated optical beam that carries the RF or microwave signals bands and the optical filtering by the tunable optical filter in FIG. 1A.

FIG. 1B illustrates the optical spectrum of the modulated optical beam 132. The optical carrier is shown to be at the laser frequency ($f_{optical\ carrier}$) and the RF or microwave signal bands or spectral components originally in the input signal 101 are now carried by the optical carrier as optical sidebands. Each optical sideband is at an optical frequency and the frequency difference between the each sideband and the optical carrier is the microwave or RF frequency of the original signal band in the signal 101.

Referring back to FIG. 1A, a tunable optical filter 140 is placed in the second optical path between the optical modulator 130 and the optical combiner 150 to optically filter the modulated beam 132 to produce a filtered optical beam 145. A tuning control unit 144 is provided to produce one or more control signals applied to the filter 140 to tune the optical frequency of the filter's transmission band. If the quality factor of the optical filter 140 is sufficiently high, the bandwidth of the optical filter 140 can be sufficiently narrow to select only one sideband to transmit in the beam 145 while rejecting two neighboring sidebands, all other sidebands and the optical carrier. The optical filter 140 is designed to achieve this filtering operation. FIG. 1B shows that the optical filter 140 is tuned to select the lowest sideband of the upper sidebands in the modulated optical beam 132. As a result, the filtered optical beam 145 has only one spectral component at the optical frequency of ($f_{optical\ carrier} + f_{RF}$).

The first optical beam 111 in the first optical path is not modulated and thus has only the optical carrier. When the first beam 111 and the filtered beam 145 are combined at the optical detector 160, the detection by the optical detector 160 presents the beat signal between the optical carrier and the filtered sideband in the detector 160. Therefore, the frequency of the output signal 102 from the detector 102 is the difference between the optical frequency of the filterted beam 145 and the first optical beam 111, i.e., the filtered RF sideband at the frequency of $f_{RF}$. This converts the filtered signal down from the optical domain back to the RF and microwave domain. The optical filter 140 can be tuned to select any of the signal sidebands carried by the modulated optical beam 132. As such, the frequency of the RF signal 102 can be tuned.

The tunable optical filter 140 may be implemented in various configurations. For example, the tuning may be achieved by thermal control of the resonator whose index, dimension, or both change with temperature, mechanical control of the resonator by changing the dimension of the resonator, electrical control, or optical control. Electro-optic materials may be used to control and tune the resonance frequency of the WGM resonator by an external control signal. For example, a single lithium niobate microresonator that supports whispering gallery modes is a tunable optical filter based on the electro-optic effect of the lithium niobate material and can be used as the filter 140.

Figure 2A:
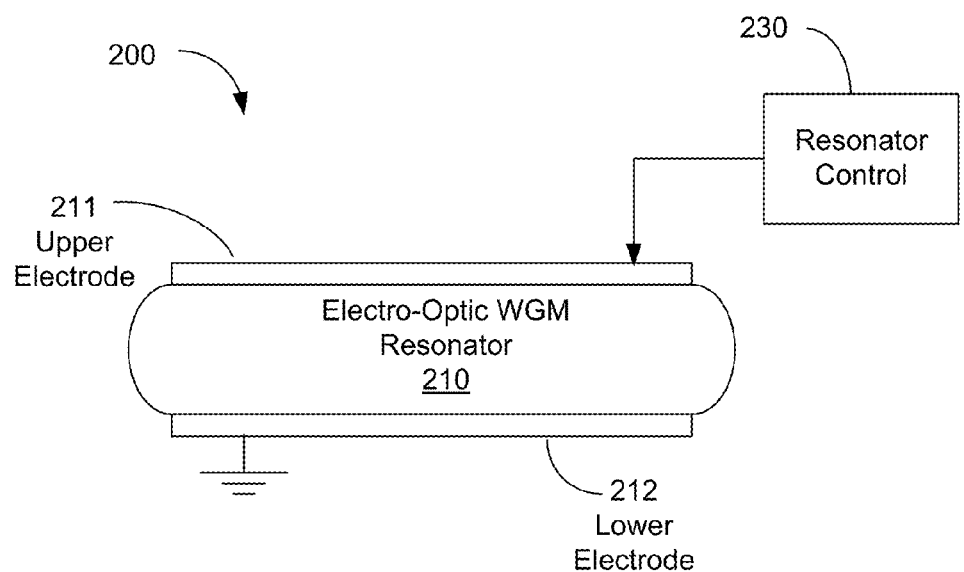
FIG. 2A shows a tunable electro-optic whispering gallery mode microresonator which may be used as a tunable optical filter.

FIG. 2A show an example of a tunable electro-optic WGM resonator 200 having a WGM resonator 210. The electro-optic material for the entire or part of the resonator 210 may be any suitable material, including an electro-optic crystal such as Lithium Niobate and semiconductor multiple quantum well structures. One or more electrodes 211 and 212 may be formed on the resonator 210 to apply a control electrical field in at least the region where the WG modes are present to control the index of the electro-optical material and to change the filter function of the resonator. Assuming the resonator 210 has disk or ring geometry, the electrode 211 may be formed on the top of the resonator 210 and the electrode 212 may be formed on the bottom of the resonator 210. In implementation, the electrodes 211 and 212 may be in various geometries to apply a control voltage to tune the resonator. For example, the electrodes 211 and 212 may be microstrip line electrodes. A tuning control unit 230 such as a control circuit may be used to supply the electrical control signal to the electrodes 211 and 212. The control voltage may be a DC voltage to set the resonance peak of the resonator 200 at a desired spectral location. The DC voltage may be adjusted by the control unit 230 to tune the spectral position of the transmission peak when such tuning is needed. For dynamic tuning operations, the control unit 230 adjusts the control voltage in response to a control signal to, e.g., maintain the transmission peak at a desired spectral position or frequency or to change the frequency of the transmission peak to a target position. In some other operations, the control unit 230 may adjust the control voltage in a time varying manner, e.g., scanning the transmission peak at a fixed or varying speed or constantly changing the transmission peak in a predetermined manner.

Figure 2B:
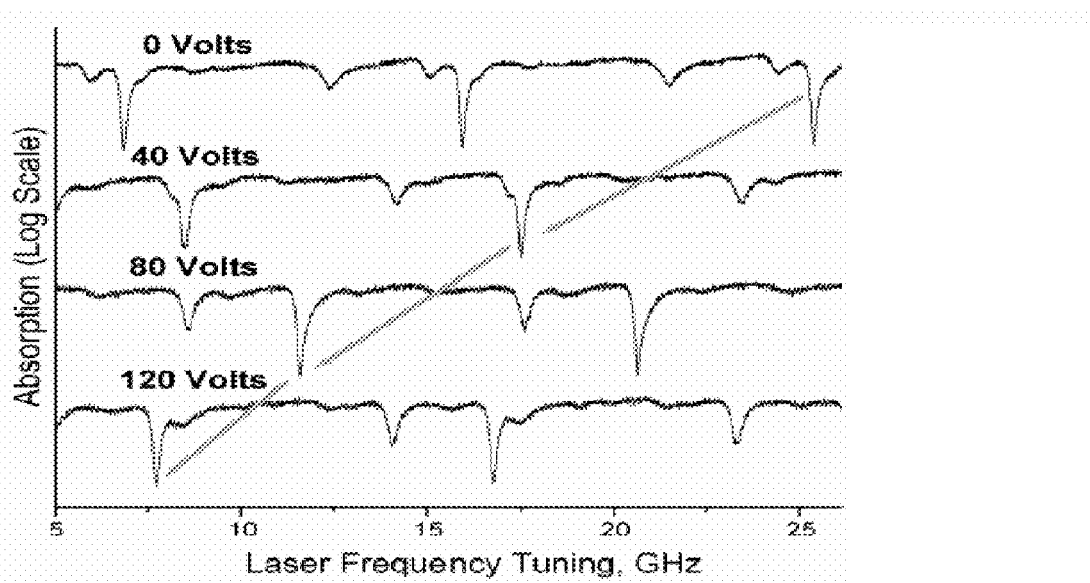
FIG. 2B shows measurements of optical absorption of a lithium niobate whispering gallery mode microresonator with a wide tuning spectral range of the whispering gallery modes under a tuning control voltage.

For example, a Z-cut $LiNbO_3$ disk cavity with a diameter of d=4.8 mm and a thickness of 170 µm may be used as the resonator 210. The cavity perimeter edge may be prepared in the toroidal shape with a 100 µm radius of curvature. As an alternative to the strip electrodes shown in FIG. 2A, the top and bottom surfaces of the disk resonator may be coated with conductive layers for receiving the external electrical control signal. A metal such as indium may be used to form the conductive coatings. Tuning is achieved by applying and adjusting a voltage to the top and bottom conductive coatings. Each conductive coating may be absent on the central part of the resonator and are present at the perimeter edge of the resonator where WGMs are localized. FIG. 2B shows optical absorption measurements on a lithium niobate microresonator showing a wide tunability of the whispering gallery modes with application of a voltage. The curves are offset vertically for clarity.

Such a single-resonator filter has a Lorentzian lineshape in its spectral transmission and presents a less than ideal passband with a relatively slow roll-off from the center transmission peak. When the signal spectral bands in the input signal 101 are close to one another, the single-resonator filter may not be sufficient to separate neighboring bands. In various implementations, two or more such tunable microresonators may be optically cascaded together in series to create a multi-pole optical filter with a flatter passband and sharper spectral roll-offs. Light can be evanescently coupled between the closely-spaced (e.g., about 1 µm) or directly contacted microresonators.

The shape of the passband function for such a cascaded multi-resonator filter may be controlled by adjusting a number of device parameters. For example, the number of microresonators sets the order of the filter and directly determines how sharply the filter response rolls-off outside the passband. The quality factors of microresonators can determine the natural linewidth of the filter function. Tunable lithium niobate microresonators may be fabricated to produce varying bandwidths, such as narrow linewidths of about 10 MHz or less, or broad linewidths at tens of MHz. The physical gaps that separate the cascaded microresonators (and the coupling prisms at either end of the series from the first and last microresonators) can be adjusted to control the coupling strengths. The gaps may be fixed in certain implementations and adjustable for maximum flexibility in dynamically reconfiguring the filter function in other implementations. Different control voltages to different microresonators may be used to provide desired offsets of the different filter poles relative to a selected center of the filter passband to achieve a desired filter spectral profile. The tuning control unit 144 may include an embedded logic unit that dynamically adjusts the offsets of the filter poles. Accurate placements of the poles can minimize ripple in the final filter passband.

The design of multi-pole optical filters with microresonators may be analogous to design multi-pole RF filters to a certain extent but the design parameters are very different. For example, the equivalent RF Q factors of microresonators are much higher than many RF filters. The equivalent RF Q factor a Microresonator is the optical Q factor multiplied by a ration of the RF frequency over the optical frequency. Hence, at the optical wavelength of 1550 nm, the ratio is about $5\times10^{-5}$ and an optical Q factor of $10^9$ is equivalent to an RF Q factor of about $5\times10^4$.

Figure 3A:
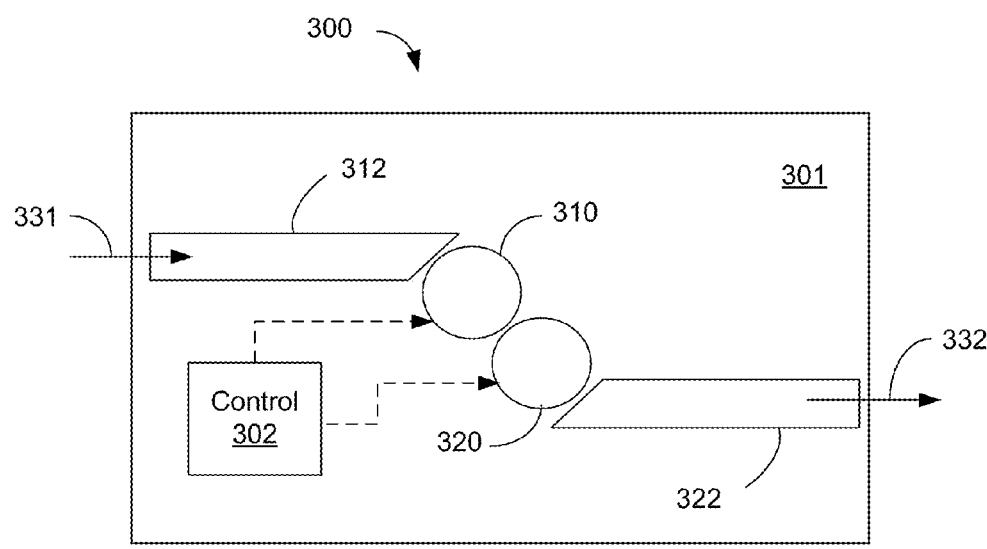
FIG. 3A shows a two-pole tunable optical filter that includes two coupled whispering gallery mode microresonators.

FIG. 3A shows an exemplary tunable two-resonator filter 300 having two cascaded WGM resonators 310 and 320. In some implementations, both resonators may have approximately the same diameter or dimension to have similar quality factors. In certain other implementations, it may be advantageous to use different resonators 310 and 320 with different geometries or physical dimension to use their difference in the spectral profile to produce the desired composite filter function. The resonators 310 and 320 are placed close to or in contact with each other to allow for direct optical coupling under proper resonance conditions. Alternatively, an optical coupling mechanism may be placed between the resonators 310 and 320 to assist and facilitate the inter-resonator optical coupling. An input optical coupler 312 is placed near or in contact with the first resonator 310 to couple an input optical signal 331 into the first resonator 310 of the filter 300. An output optical coupler 322 is placed near or in contact with the second resonator 320 to couple optical energy inside the second resonator 320 out to produce an output optical signal 332 as the transmission of the filter 300. As illustrated, a support base 301, such as a substrate, may be used to hold and fix the components of the filter 300 in position. A control unit 302 is provided to control and tune at least one of the resonators 310 and 320 to make the filter 300 tunable. In some implementations, both resonators 310 and 320 may be tunable.

Figure 3B:
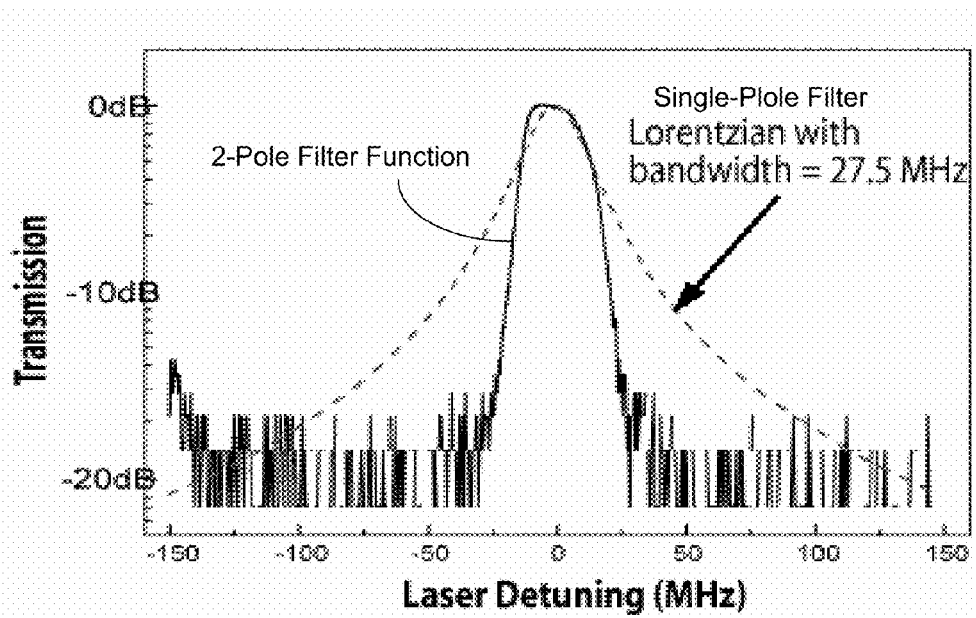
FIG. 3B shows a measured transmission spectrum of a 2-pole optical filter with two silica whispering gallery mode microresonators to illustrate a sharper roll-off than a Lorentzian transmission spectrum of a single microresonator. The floor at −20 dB is an artifact of the measurement and does not represent a limitation of the filter.

FIG. 3B shows a measured spectrum of a 2-pole filter with two silica microresonators coupled in series. A single pole filter function of a single microresonator is shown in a dashed curve as a comparison. The measured 2-pole filter function has a flatter top and sharper spectral roll-off and hence is better suited for filtering different signal bands as illustrated in FIG. 1B.

Figure 4:
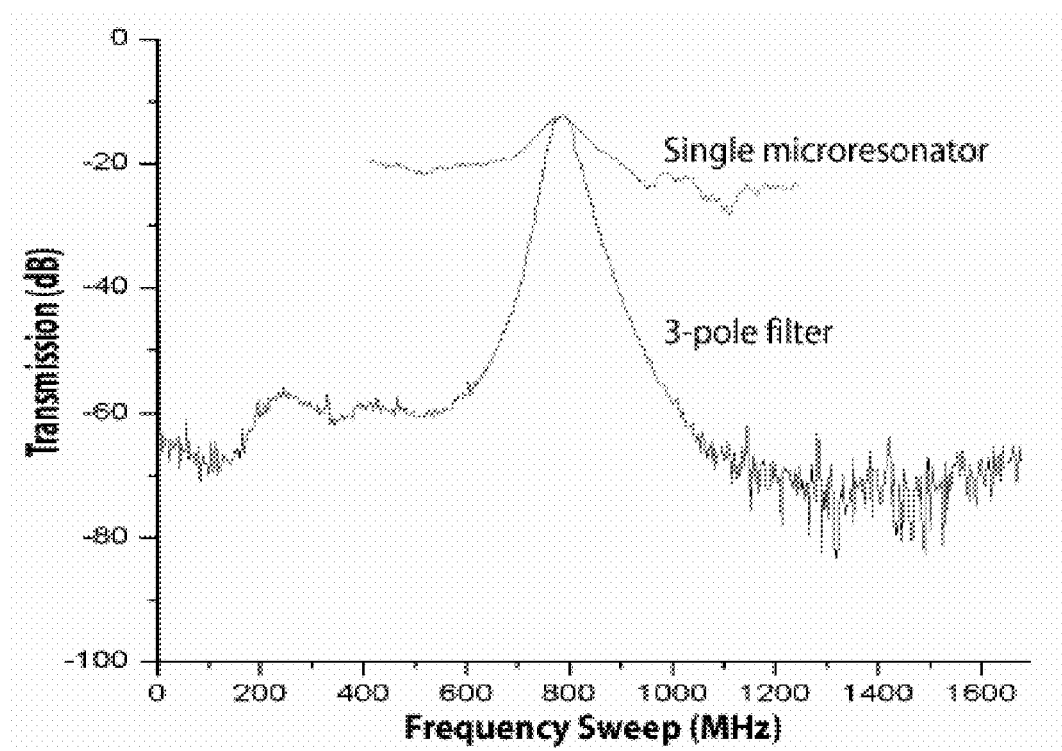
FIG. 4 shows a measured transmission spectrum of a 3-pole lithium niobate optical filter with three cascaded lithium niobate whispering gallery mode microresonators as shown in FIG. 1A. The overlay shows the response of a single-resonator filter with its peak normalized to the peak of the 3-pole response.

FIG. 4 shows measured filter functions for a 3-pole microresonator filter constructed from three lithium niobate microresonators and a single microresonator filter. Tunability was exploited only over a narrow range to set the frequency offsets of the filter poles precisely and optimize the filter transmission function. The filter allows for wide (tens of gigahertz) tunability of filter center frequency with preservation of the shape of the filter's multi-pole transmission function (and thus the filter's performance characteristics) over the same broad range. Additionally, the bandwidth of the filter can be varied by adjusting the loading of resonators by means of changing one or several of the coupling gaps in the filter.

A number of technical issues associated with implementation of multi-resonator filters are addressed below. The electro-optic effect in lithium niobate is evident in FIG. 2B. Hence, the transmission peak frequencies and the corresponding control voltages response should be measured throughout the operating range carefully so that the filter control can be programmed to tune the filter to any desired frequency. The voltages applied to different microresonators in a filter can be controlled independently to ensure proper spacing of the offsets of the pole frequencies. As a filter tunes over its full operating spectral range, the whispering gallery mode amplitudes, shapes and coupling constants of the microresonators may vary slightly. Such variations can be measured and calibrated to control the filter function during tuning. Deliberately shifting the offsets of the pole frequencies relative to the tunable center of the bandpass may be used to compensate for these variations and preserve the optimal shape of the filter function. This additional level of control should also permit some dynamic adjustment of the filter's bandwidth.

Referring back to FIG. 1A, a tunable 3-pole filter is shown as an example for the tunable filter 140. Three electro-optic WGM microresonators 143 are cascaded in series between an input optical coupler 141 and an output optical coupler 142. The couplers 141 and 142 are shown as prisms but other implementations such as angled fiber tip couplers and photonic gap material couplers may also be used. Three separate control voltages V1, V2, and V3 are generated from the control unit 144 to control and tune the three resonators 143, respectively. In other implementations, four or more microresonators may be cascaded to form desired final filter functions.

The tunable optical filter 140 in FIG. 1A may also be implemented by tunable filters that include two or more optical resonators and two separate optical waveguides. The two or more optical resonators that are optically coupled with one another to produce an optical resonance transmission peak that is narrower than the natural transmission linewidth of each resonator. The optical coupling of the resonators causes optical interference between the resonators (e.g., interference of their optical delays) that leads to the narrow transmission peak. The resonators may be directly coupled with one another, indirectly coupled with one another via optical waveguides, or coupled both directly between two adjacent resonators and indirectly via waveguides. At least one of the resonators is tunable to change its resonance frequency to adjust the center frequency of the narrow transmission peak and the optical delay in light spectrally located in the narrow transmission peak. Notably, the described device designs and techniques are applicable to other electromagnetic frequencies outside the optical spectral range, such as the microwave and millimeter frequencies where microwave resonators and waveguides, for example, are used to implement the desired wave coupling and tuning in frequency.

The specific examples described here are in optical domain and use optical waveguides and whispering gallery mode resonators. In particular, device designs with a parallel configuration of two interacting whispering-gallery-mode optical resonators are described to show a narrowband modal structure as a basis for a widely tunable delay line. The optical coupling can be optimized so that such devices produce an unusually narrow spectral feature with a much narrower bandwidth than the loaded bandwidth of each individual resonator.

This effect of the devices described here is analogous to the phenomenon of electromagnetically induced transparency (EIT) in resonantly absorbing quantum systems. The quantum-mechanical interference of spontaneous emissions from two close energy states coupled to a common ground state results in ultranarrow resonances in EIT. The devices and techniques described here produce similar narrow resonances based on classic cavity modes and the interference between direct and resonance-assisted indirect pathways for decays in two coupled resonators. This is the same Fano resonance for optical resonators that has been shown to result in sharp asymmetric line shapes in a narrow frequency range in periodic structures and waveguide-cavity systems.

Figure 5A:
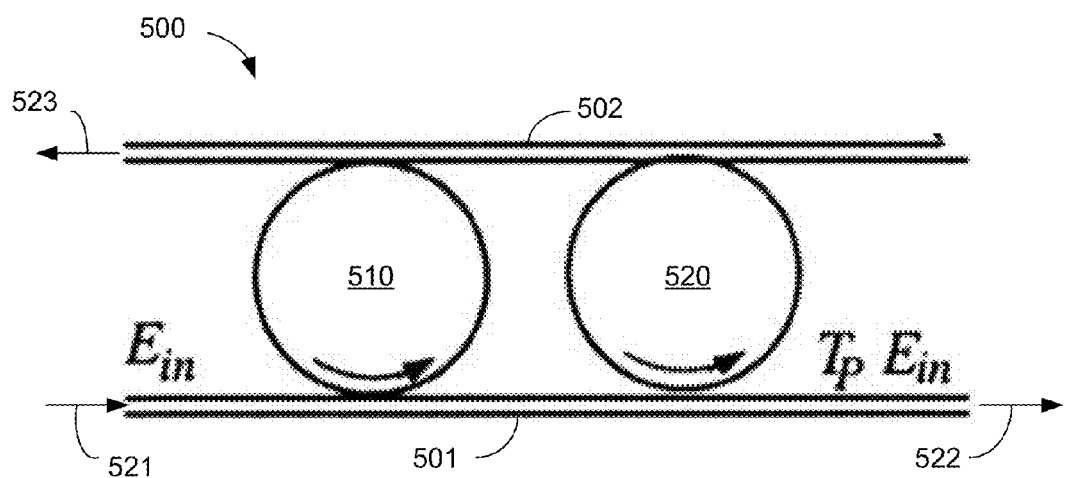
FIG. 5A shows an example of a resonator-based device showing two coupled resonators to produce a narrow transmission peak with tunable peak frequency, delay and spectral linewidth.

FIG. 5A shows one example of a tunable optical filter 500 with two optical resonators 510 and 520 optically coupled to two separate optical waveguides 501 and 502. The two waveguides 501 and 502 are shown to be parallel but may not necessarily so in implementations. The first resonator 510 is optically coupled to the first waveguide 501 at a first location of the resonator 510 to exchange optical energy with the first waveguide 501 and to the second waveguide 501 at a second location of the resonator 510 to exchange optical energy with the second waveguide 502. The optical coupling with each waveguide may be evanescent coupling. The second resonator 520 is coupled to the waveguides 501 and 502 in a similar configuration. The resonators 510 and 520 may be implemented in various configurations such as ring resonators and whispering gallery mode (WGM) resonators. A suitable ring resonator may be formed in waveguide rings like fiber rings or integrated waveguide rings on substrates or by three or more reflectors to form a closed optical loop. A WGM resonator may be implemented in a number of configurations, including, microsphere WGM resonators, microdisk WGM resonators with spherical and non-spherical exterior surfaces, and microring WGM resonators with spherical and non-spherical exterior surfaces. The non-spherical exterior surfaces may be spheriodal surfaces of spheroids or conic surfaces. The two waveguides 501 and 502 may be implemented by, e.g., fibers and integrated waveguides formed on substrates.

The two resonators 510 and 520 may be spaced from each other so there is no direct optical coupling between the two resonators 510 and 520. Alternatively, the two resonators 510 and 520 may be directly coupled to each other to exchange optical energy without relying on optical coupling via the waveguides 501 and 502. Regardless whether there is a direct coupling between the two resonators 510 and 520, the two waveguides 501 and 502 provide an optical coupling mechanism between the resonators 510 and 520. In FIG. 5A, an input optical signal 521 is shown to enter the first waveguide 501 as an input $E_{in}$. A portion or the entirety of the signal 521 is coupled into the first resonator 510 and circulates in the resonator 510. A portion of the optical energy in the resonator 510 is coupled back into the first waveguide 501 which is subsequently coupled, either partially or entirely, into the second resonator 520. A portion of the optical energy circulating in the second resonator 520 is coupled back into the first waveguide 501 as the transmitted output 522 represented by $T_p E_{in}$, where $T_p$ is the transmission coefficient of the tunable device 500. The spectrum of the transmission coefficient $T_p$ includes a narrow transmission peak whose frequency is determined by the resonance frequencies of the two resonators 510 and 520.

In the design in FIG. 5A, the second waveguide 502 produces a reflected optical signal 523 by coupling with the two resonators 510 and 520. The coupling between the waveguide 502 and the first resonator 510 couples a portion of the optical energy circulating in the resonator 510 into the second waveguide 502 as part of the reflected signal 523. In addition, the coupling between the waveguide 502 and the second resonator 520 couples a portion of the optical energy circulating in the resonator 120 into the second waveguide 502 which is further partially or entirely coupled into the first resonator 510.

Figure 5B:
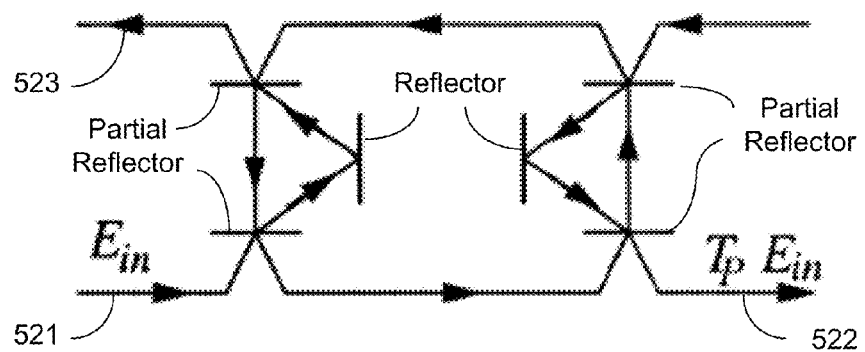
FIG. 5B shows an optical device with two ring resonators that is equivalent to the device shown in FIG. 5A in certain aspects.

Therefore, the optical configuration of the tunable filter 500 provides an optical circulation and storage mechanism to circulate and retain light between the two resonators 510 and 520 and the segments of the waveguides 501 and 502 between the resonators 510 and 520. A portion of light circulating and stored in the device 500 is reflected back in the waveguide 502 as the reflected signal 523 and another portion of the light is transmitted through the two resonators 510 and 520 as the transmitted signal 522 in the waveguide 501. FIG. 5B shows optical paths of the device 500 when the two resonators 510 and 520 are two ring cavities each having three reflectors represented by short straight lines.

The spatially overlapping and mixing of light from the two different resonators in FIG. 5A allow for the optical interference to occur and the narrow transmission peak and the circulation of light between the two resonators 510 and 520 leads to the optical delay for light in the narrow transmission peak. The following sections provide detailed explanation for the occurrence of the subnatural (i.e., narrower than loaded individual resonator 510 or 520) EIT-like linewidths. Such a device may be operated as a slow light element to produce a variable or tunable optical delay in an optical signal. Notably, one or all of the resonators 510 and 520 may be tunable resonators to tune the spectral linewidth, the delay time, and the frequency of the narrow transmission peak of the device 500. Such a tunable resonator may be designed to include various tuning mechanisms that change the resonance frequency of the resonator in response to an external control signal. As an example, WGMs in electro-optic crystalline WGM resonators may be used to provide tuning in frequency and bandwidth in the device 100 in FIG. 1A by adjusting a control signal applied to electrodes formed on the tunable resonator 110 or 120. The device in FIG. 1B may be tuned by adjusting one or more reflectors in each ring resonator to change the resonance frequency of the ring resonator via a suitable positioning mechanism that controls the position of the mirror under control, e.g., a piezo transducer.

The transmission coefficient for the tunable device 500 in FIG. 5A can be mathematically expressed as follows:

$$T_P = \frac{[\gamma + i(\omega - \omega_1)][\gamma + i(\omega - \omega_2)]}{[2\gamma_c + \gamma + i(\omega - \omega_1)][2\gamma_c + \gamma + i(\omega - \omega_2)] - 4\exp(i\psi)\gamma_c^2}, \quad (1)$$

where $\gamma$ and $\gamma_c$ are spectral linewidths caused by intrinsic cavity losses and coupling to the waveguides 101 and 102, respectively; frequencies $\omega_1$ and $\omega_2$ are resonance frequencies of modes of the resonators 510 and 520, respectively; the frequency $\omega$ is the carrier frequency of the input light; and $\psi$ stands for the coupling phase that varies with the distance between the two resonators 510 and 520.

Consider a strong coupling regime $\gamma_c \gg |\omega_1 - \omega_2| \gg \gamma$ in the tunable device 500. Assuming the frequency tunings between the input light and the resonance frequencies of the two resonators 110 and 102, $|\omega - \omega_1|$ and $|\omega - \omega_2|$, to be much less than the free spectral ranges of the two resonators 510 and 520 and let $\exp(i\psi) = 1$, the power transmission of the tunable device 500 based on the above transmission coefficient shows two minima, $$|T_P|_{min}^2 \approx \gamma^2/4\gamma_c^2,$$

when the frequency of the input light is tuned to the resonance frequencies of the two resonators 510 and 520: $\omega = \omega_1$ and $\omega = \omega_2$. Notably, the power transmission of the device 510 also has a local maximum at the average frequency of the two resonance frequencies of the resonators 510 and 520, $\omega = \omega_0 = (\omega_1 + \omega_2)/2)/2$. The local maximum is given by $$|T_P|_{max}^2 = \frac{(\omega_1 - \omega_2)^4}{[16\gamma\gamma_c + (\omega_1 - \omega_2)^2]^2},$$

Figure 5C:
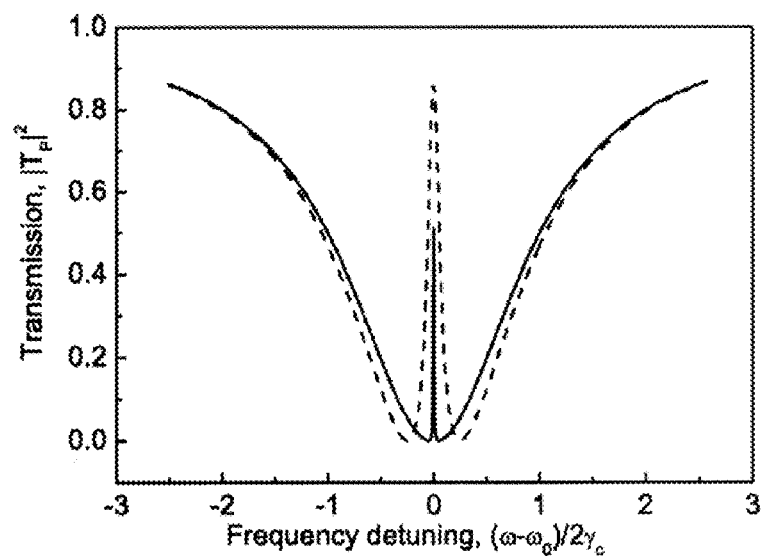
FIG. 5C shows a transmission spectrum of the transmitted signal in the device in FIG. 5A where the resonators are optical whispering gallery mode (WGM) resonators that are not directly coupled to each other and are coupled via two optical waveguides.

This local maximum is the peak of a narrow transparency feature or transmission peak whose spectral position and linewidth can be tuned by tuning either one or both of the resonators 510 and 520. FIG. 5C illustrates this transmission peak from the device in FIG. 5A. The device in FIG. 5B can also be used to achieve this transmission peak. Notably, when each resonator is lossless ($\gamma = 0$), the width $\Gamma$ of the transparency feature may be arbitrarily narrow and is given by $$\Gamma = \frac{[16\gamma\gamma_c + (\omega_1 - \omega_2)^2]^2}{16\gamma_c(\omega_1 - \omega_2)^2}. \quad (2)$$

That is, the frequency difference between the resonance frequencies of the two resonators 510 and 120 can be reduced to reduce the width $\Gamma$ by tuning one or both of the resonators 510 and 520. The group time delay that is originated from the narrow transparency resonance in the transmitted light is approximately $\tau_g \approx \Gamma^{-1}$:

$$\tau_g \simeq \frac{16\gamma_c(\omega_1 - \omega_2)^2}{[16\gamma\gamma_c + (\omega_1 - \omega_2)^2]^2} \gg \gamma_c^{-1}.$$

Therefore the tunable device 500 can produce a large and tunable optical delay in transmitted light and operate as an efficient source of slow light. This tunable delay exceeds the minimum group delay available from a single resonator.

The origin of this subnatural structure in the transmission spectrum of the tunable device 500 with coupled resonators 510 and 520 lies in the interference of the optical decays in the resonators 510 and 520. In fact, in the overcoupled or strong regime considered here, the resonators 510 and 520 decay primarily into the waveguides 501 and 502 rather than the free space around the resonators 510 and 520. As such, there are several possible optical paths for photons transmitted through the resonators 510 and 520, and the photons may interfere because they are localized in the same spatial configurations determined by the waveguides 501 and 502. The optical transmission of the tunable device 500 is nearly canceled when the light is resonant with one of the resonant modes, $\omega_1$ or $\omega_2$, of resonators 510 and 520. However, the interference between the resonators 510 and 520 results in a narrow transmission resonance.

Figure 6A:
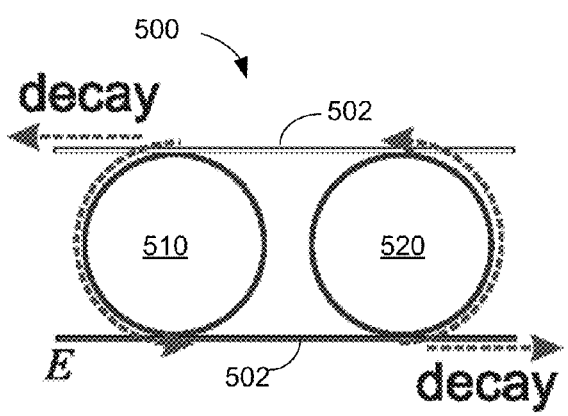
FIG. 6A shows the optical path ways in the optical device described in FIG. 5A for producing the interference between decays of the two WGM resonators.
Figure 6B:
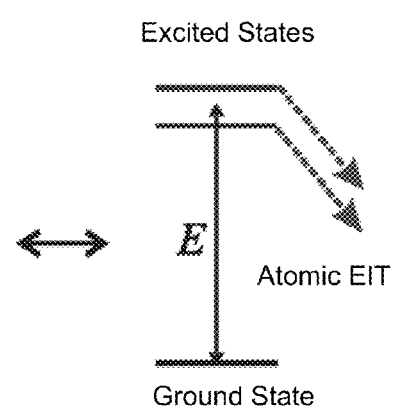
FIG. 6B shows an analogous atomic system that produces electromagnetically induced transparency under proper optical pumping.

FIG. 6A illustrate the path ways for the interference in the tunable device 500. This phenomenon is similar to the narrow transparency of EIT originating from the decay interference shown in FIG. 6B for a typical three-level atomic system that may be used to produce EIT. The delays of the two close excited states interfere with each other to produce the narrow transparent peak at a frequency where light would be strongly absorbed in absence of the delay interference.

The tunable device 500 and other devices described here based on coupled optical resonators as optical delay lines and optical filters have several advantages over the atomic, slow light systems. For example, the resonator-based devices described here produce an optical delay that depends on the frequency difference ($\omega_1 - \omega_2$) between the resonant frequencies of the two resonators. Since at least one of the resonators in the devices described here is a tunable resonator, this frequency difference can be tuned to tune the delay time. The tuning may be accomplished easily, for example, by use of resonators made from electro-optic materials such as certain crystals like lithium niobate crystals. The delay time corresponds to linewidth of the device. Hence, the linewidth can be changed or tuned by tuning one or more tunable resonators in the device. This tunable linewidth may be changed in a wide range based on the designs of the resonators, e.g., from hundreds of kilohertz to several gigahertz.

Another advantage of the current devices is that the frequency of the transparency peak is the average frequency of the two resonance frequencies of the two resonators 510 and 520, $[(\omega_1 + \omega_2)/2]$, and thus is arbitrary in the sense that it is tunable by changing either or both of the resonance frequencies $\omega_1$ and $\omega_2$. Notably, the frequency of the transmission peak is continuously tunable in a wide tuning range and thus can be tuned to any desired frequency within the tuning range.

This tuning capability is desirable in many applications such as devices or modules that use optical filtering devices and optical switching devices.

In addition, the resonator-based devices described here can be designed to have much lower optical losses because WGM resonators may be designed and manufactured to have very high quality factors on the order from $10^6$ to $10^9$.

The tunable device 500 in FIG. 5A uses optical coupling of two optical resonators to achieve narrow spectral features and to tune at least one of the resonators to adjust the spectral features. The linewidth of the transmission peak of the tunable device 500 could be much narrower than the spectral width of each loaded resonator. The lower limit of the linewidths of such features is limited by optical losses caused by the intrinsic absorption and scattering in the resonator material and the resonator exterior surfaces. The design for the tunable device 500, however, is not limited to the configuration with two resonators. One or more additional optical resonators may be coupled to the two resonators 510 and 520 via the waveguides 501 and 502 to form tunable devices with a chain of three or more coupled resonators.

In the above examples, two adjacent optical resonators are not directly coupled to each other but are indirectly coupled via the waveguides 501 and 502. Alternatively, two adjacent optical resonators, such as 510 and 520, may be directly coupled to each other provide direct exchange of energy between the resonators 501 and 502 in addition to the optical coupling via the waveguides 501 and 502. As one example, the two resonators 510 and 520 may be sufficiently close to or in direct contact with each other to exchange optical energy via evanescent fields of the resonant modes of the two resonators. In addition, an optical coupling element may be used between the two resonators 510 and 520 to provide this direct optical coupling without relying on the waveguides 501 and 502. Examples of the optical coupling element include an optical grating, which may be inserted between the resonators or directly formed on the surface of at least one resonator, and a photonic band gap material inserted between the resonators. This direct optical coupling between two adjacent optical resonators in combination with the optical coupling via the waveguides provides unique spectral features in devices for high-order optical filtering.

Figure 7A:
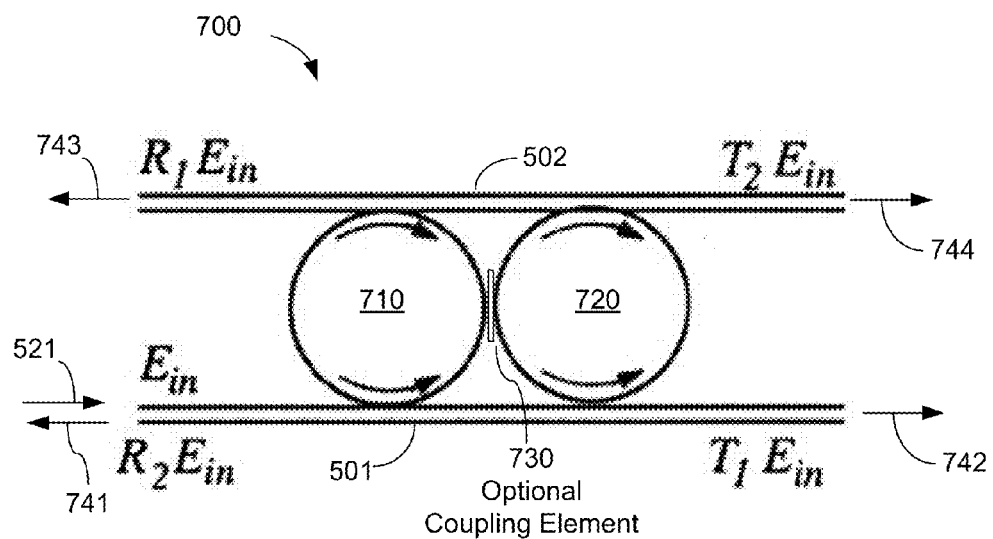
FIG. 7A shows another example of a resonator-based device where two resonators are directly coupled to each other in addition to coupling via two waveguides.

FIG. 7A shows a device 700 that use two separates optical waveguides 501 and 502 to couple two optical resonators 710 and 720 in a similar configuration as in the device 500 in FIG. 5A. However, different from the device 500, the two resonators 710 and 720 are directly coupled to each other to exchange optical energy with or without an optical coupling element 730 between the resonators 710 and 720. In one implementation, the resonators 710 and 720 are placed close enough to have a nonzero side coupling. Hence, the resonators 710 and 720 are coupled to each other via two different mechanisms: the indirect coupling via the waveguides 501 and 502 and direct coupling without the waveguides. The present of this new direct coupling adds additional path ways for the optical signals to overlap and mix.

Referring back to FIG. 5A, without the direct coupling between the two resonators 510 and 520, the optical signals in both resonators circulate in the clockwise direction when the input signal 521 is directed into the device 500 via the first waveguide 501 as illustrated. Two output signals are generated: the reflected signal 523 to the left side of the second waveguide 502 and the transmitted signal 522 to the right in the first waveguide 501. In comparison, the same input signal 521, in the presence of the direct coupling between two resonators 710 and 720 in the device 700, will lead to counter-propagating signals in each of the two resonators 710 and 720 and four output signals 741, 742, 743, and 744. The signal 741 is the first reflected signal from the device 700 in the first waveguide 701, the signal 742 is the first transmitted signal in the first waveguide 701, the signal 7343 is the second reflected signal in the waveguide 502 and the signal 744 is the second transmitted signal in the waveguide 502.

One notable effect of the added direct coupling in device 700 is that a third-order filter function can be generated with the two resonators 710 and 720. This is in contrast to previous belief that a second-order filter function is generated by cascading two WGM resonators.

Figure 7B:
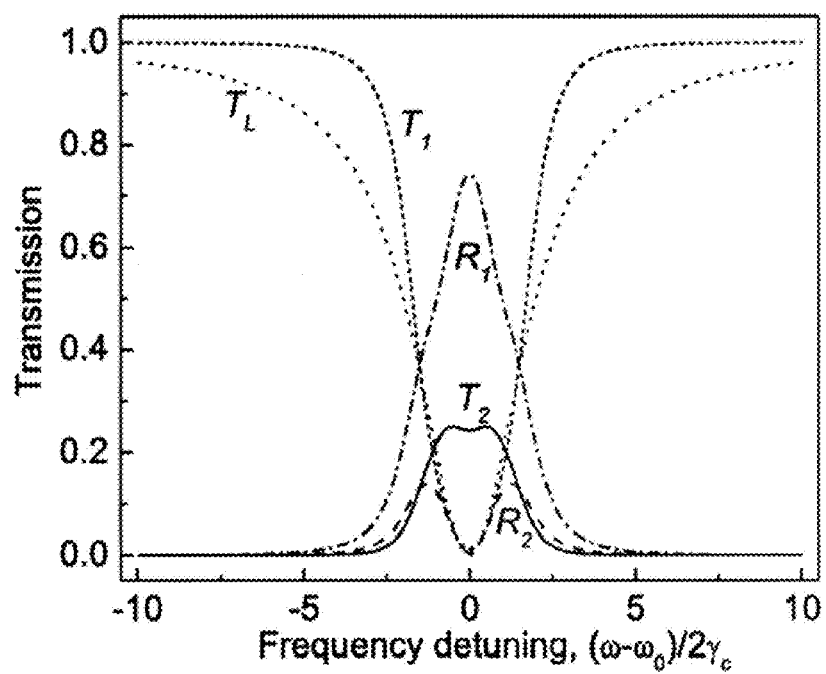
FIG. 7B shows the signal spectra in the device in FIG. 7A when the resonators are WGM resonators.
Figure 7C:
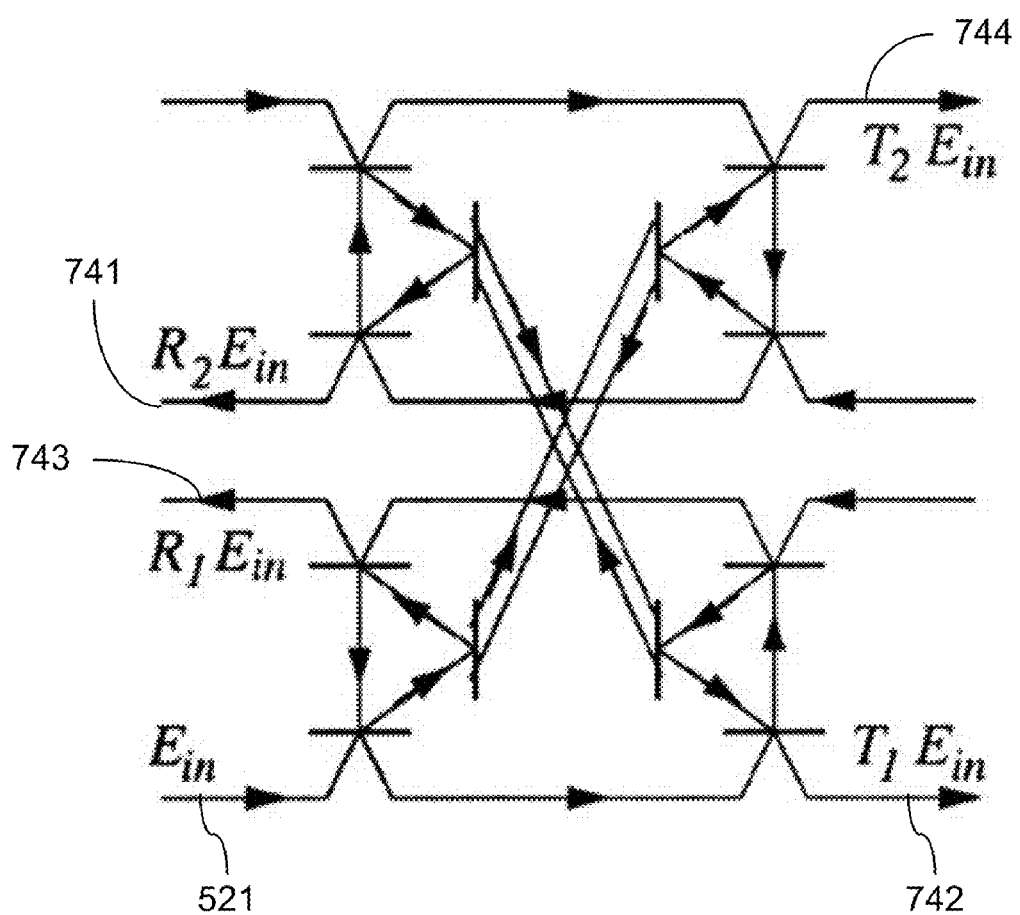
FIG. 7C shows an optical device with four ring resonators that is equivalent to the device shown in FIG. 7A in certain aspects.

FIG. 7B shows the spectra of the two transmitted signals 742 and 744 in FIG. 7A. The amplitudes of the transmission and reflection decrease as the third power of the detuning from the central filter frequency $\omega_o$. This unusually increased order filter function arises from the presence of two degenerate modes in each optical resonator (e.g., ring resonator or WGM resonator). With indirect coupling via the waveguides 501 and 502 and the direct coupling between the resonators 710 and 720, the device 700 becomes equivalent to a system of four coupled ring resonators when all those four modes are coupled as shown in FIG. 7C. The narrow spectral feature is absent from the spectra in FIG. 3B because of the choice of coupling phase $\psi=\pi/2$ used in the computations shown in FIG. 7B for the device 700 and will be present when the coupling phase is $\pi$. Therefore, the device 700 can be used as a high-order optical filter that has a much flatter passband and a sharper roll-off than a Lorentzian transfer function filter based on a single resonator, and than a second-order filters that use two cascaded resonators without the complex coupling shown in FIG. 7A.

The device 700 may have one or more resonators that are tunable to tune the spectral response of the device 700. Similar to the device 700 in FIG. 5A, one or more resonators may be added between the waveguides 501 and 502 in device 700.

Figure 8A:
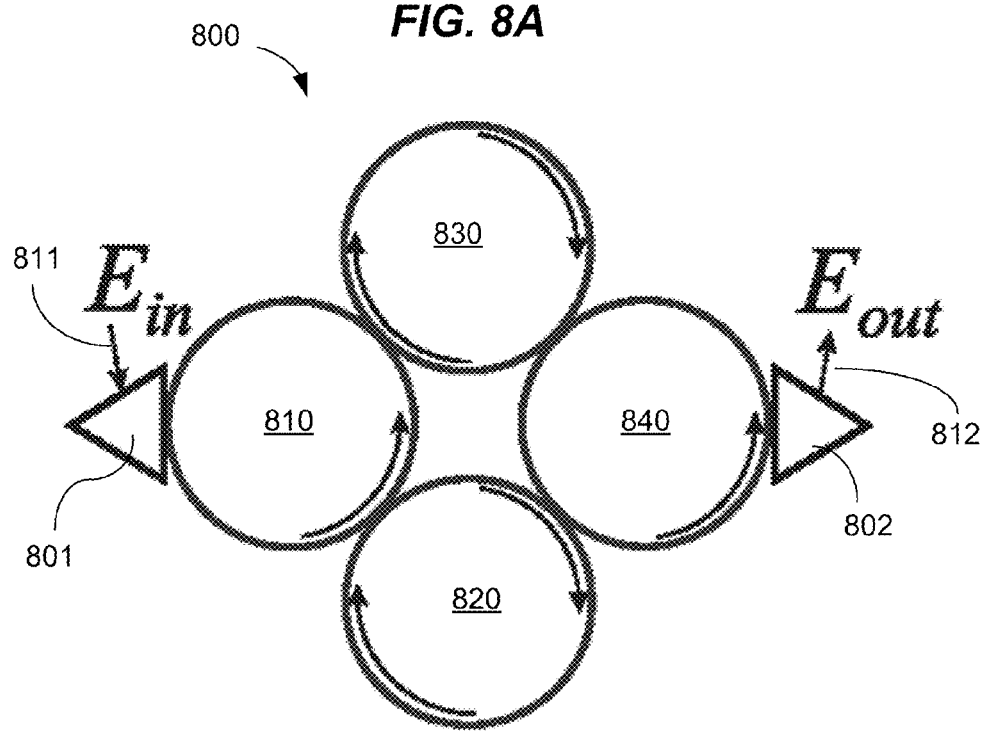
FIGS. 8A and 8B show resonator-based devices with four coupled resonators in two different configurations.

FIG. 8A shows another resonator-based device 800 having four directly coupled optical resonators 810, 820, 830, and 840. The resonators may be implemented as, for example, ring resonator or WGM resonators. The direct coupling between two resonators may be effectuated by close proximity or direct contact via evanescent fields, or by using an optical coupling element between two coupled resonators. An input optical coupler 801 is used to couple an input signal 811 into the resonator 810 and an output optical coupler 802 is used to couple light out of the resonator 840 as an output signal 812. Micro prisms, tapered fibers, photonic band gap materials, and others may be used as the optical couplers 801 and 802. The direct coupling between two resonators is the sole coupling mechanism to keep the light circulating within the four resonators. As illustrated, the optical signals in the resonators 810 and 820 are in the counter clockwise direction while the optical signals in the resonators 820 and 830 are in the clockwise direction. There is no reflected signal in the device 800. The device 800 may have one or more resonators that are tunable to tune the spectral response of the device 800.

Figure 8B:
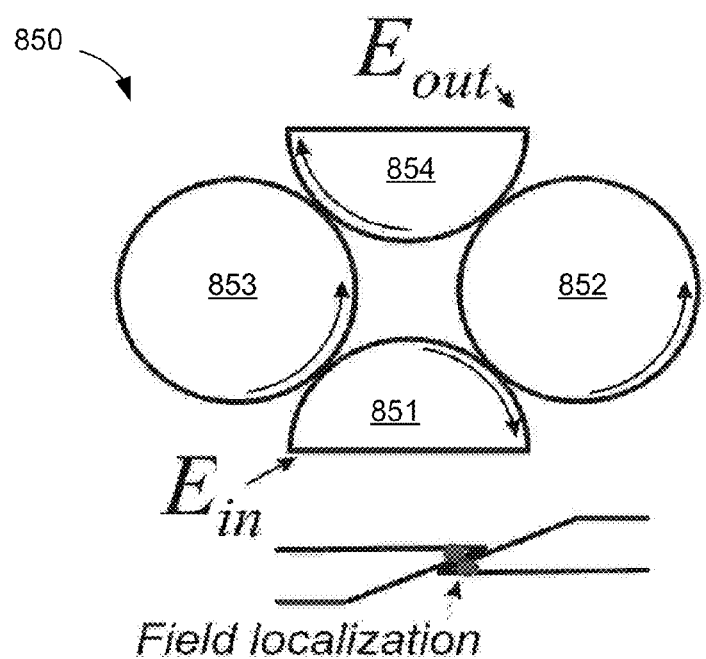

FIG. 8B shows another 4-resonator device 850 where resonators 851, 852, 853, and 854 are optically coupled to one another similar to the device 800 in FIG. 8A. Hence, like the device in FIG. 8A, the direct coupling between two resonators in device 850 may be effectuated by close proximity or direct contact via evanescent fields, or by using an optical coupling element between two coupled resonators. The input resonator 851 and the output resonator 852 may be half spheres or half disks to allow input and output optical coupling while resonators 852 and 853 are spheres or disks.

The above specific examples of tunable RF or microwave filters based on optical filtering and tuning use optical tunability of the optical filter 140 in FIG. 1A to optically select a spectral component or signal band from the original input signal 101 and thus tune the frequency of the output signal 102. The optical tuning is essentially to change the frequency difference between the optical carrier of the modulated optical beam 132 and the center frequency of the transmission passband of the optical filter 140 so that the optical filter can optically select any of the signal bands in the input signal 101 carried by the optical carrier as the output signal 102.

Hence, the optical tuning may be achieved by tuning either one or both of the optical carrier frequency of the optical beam and the center frequency of the transmission passband of the optical filter. In some implementations, it is beneficial to use a tunable filter as shown in FIG. 1A and a fixed laser. In other implementations, it may be beneficial to tune the laser frequency while using a fixed optical filter. Hence, optical tuning may be achieved by tuning the frequency of the optical carrier, e.g., the laser frequency of the laser 110 relative to the center frequency of the transmission passband of the filter 140. Accordingly, the filter 140 is replaced by a fixed narrow-band high-Q optical filter and the laser 110 is replaced by a tunable laser that can be tuned over the tuning range of the tunable RF or microwave filter. It is further contemplated that the laser and the optical filter may both be tuned to expand the tuning range of the tunable RF or microwave filter.

Specific tunable RF and microwave filters with tunable lasers and fixed optical filters are described below as examples.

Figure 9:
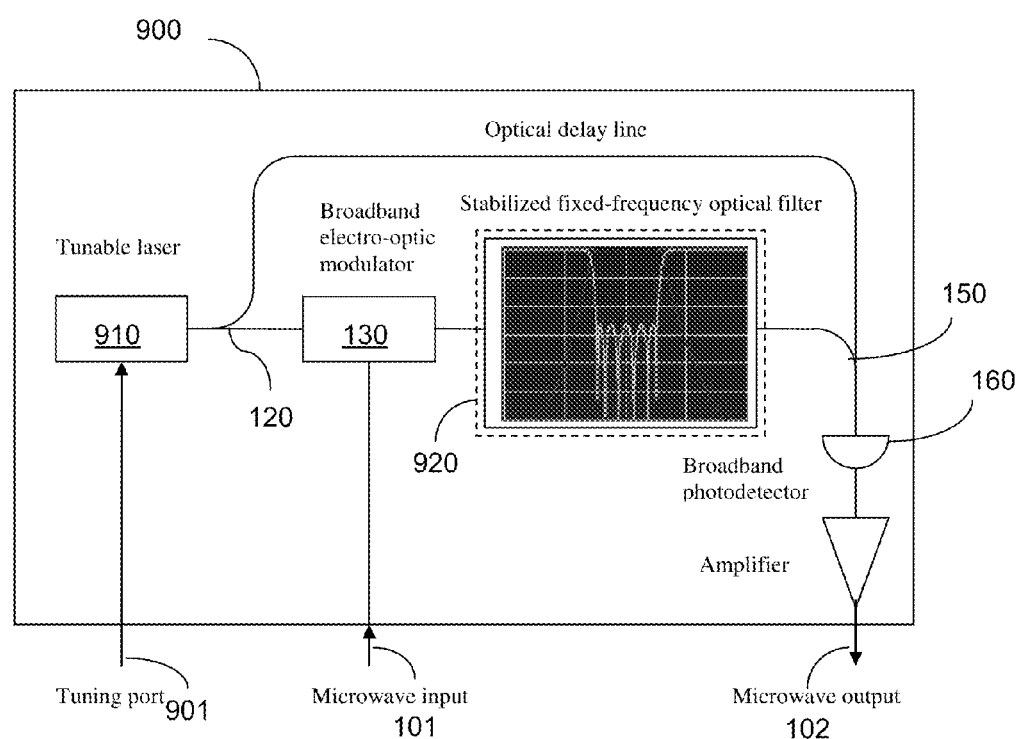
FIG. 9 shows an example of a tunable RF or microwave filter with a tunable laser to tune the laser frequency relative to the center frequency of the transmission band of the optical filter in tuning the frequency of the filtered RF or microwave output signal.

FIG. 9 shows an example of a tunable RF or microwave filter 900 that uses a tunable laser 910 to achieve the tuning and a fixed optical filter 920 to achieve the filtering. The RF or microwave signal 101 is up-converted into the optical domain using the broadband modulator 130 and the filtering is done in optical domain using the fixed frequency high-Q optical filter 920 which may be a single-pole or a multi-pole filter. The RF signal is restored by recombining the filtered optical beam with optical carrier on the broadband photodetector 160. The laser frequency of the laser 910 is controlled by and tuned in response to a tuning control signal 901 received at a tuning port from a control unit.

Figure 10:
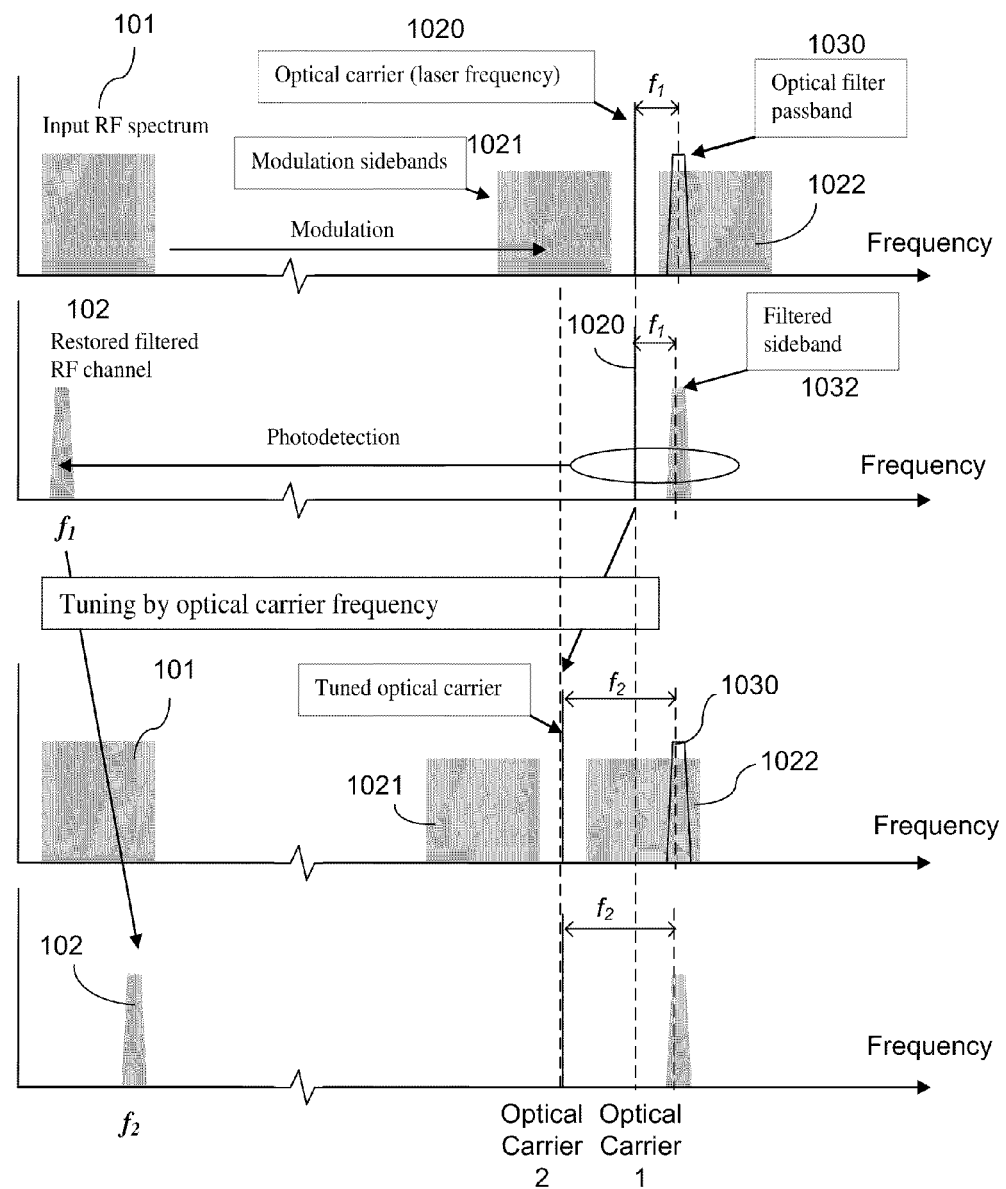
FIG. 10 shows spectra of the modulated optical beam that carries the RF or microwave signal bands of the input RF or microwave signal and the optically filtered modulated optical beam to illustrate operations of the filter in FIG. 9.

FIG. 10 illustrates operation of the filter 900 in FIG. 9. The input RF signal 101 has an input RF spectrum as shown and is converted via the optical modulation by the modulator 130 into two modulation sidebands 1021 and 1022 on opposite sides of the optical carrier 1020. Any one of modulation sidebands 1021 and 1022 may be used to select a particular RF signal band as the output signal 102. As an example, the laser 910 is tuned to place a signal band in the modulated optical beam at ($f_{optical\ carrier}$+f1) within the fixed passband 1030 of the optical filter 920. The filtered signal band out of the optical filter 920 is represented by numeral 1032. The optical detection of the optical carrier 1020 and the filtered signal band 1032 produces the output signal 102 at the selected frequency f1.

If the laser 910 is subsequently tuned to change the optical carrier 1020 to a different optical carrier, e.g., the optical carrier 2 at a lower frequency then the initial optical carrier 1, this tuning shifts frequencies of the modulation sidebands 1021 and 1022 to lower frequencies by the same amount. This change in the optical carrier frequency places a different part of the upper modulation sideband 1022 within the fixed passband 1030 of the optical filter 920 to select a signal band with a higher frequency f2 as the filtered output signal 102 from the optical detector 160.

Figure 11:
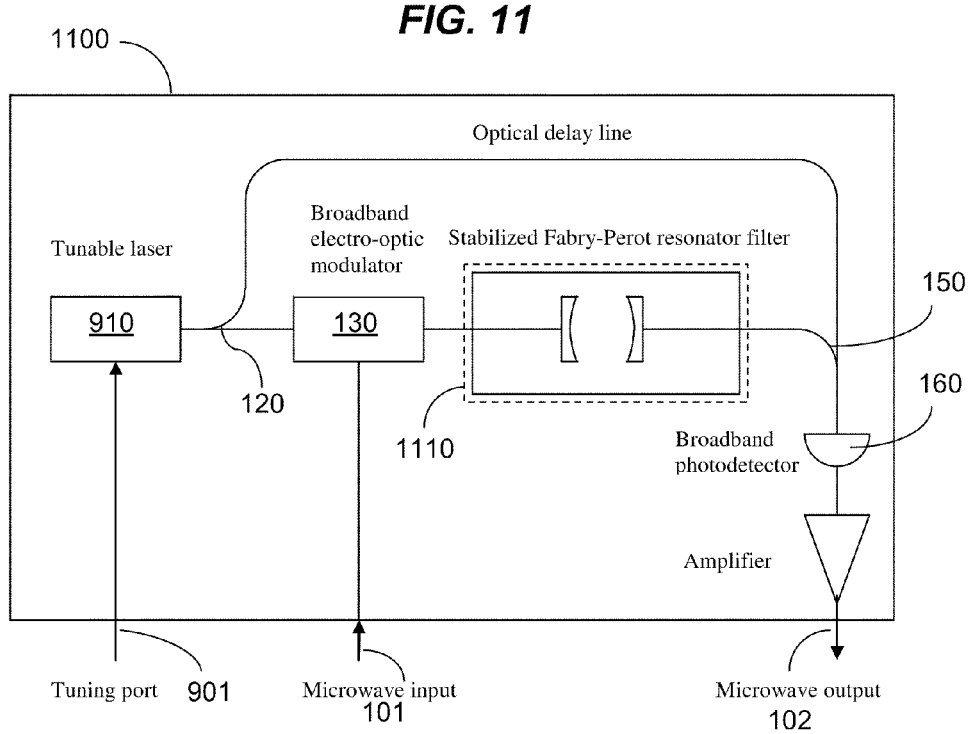
FIGS. 11 and 12 shows two exemplary implementations based on the filter design in FIG. 10.
Figure 12:
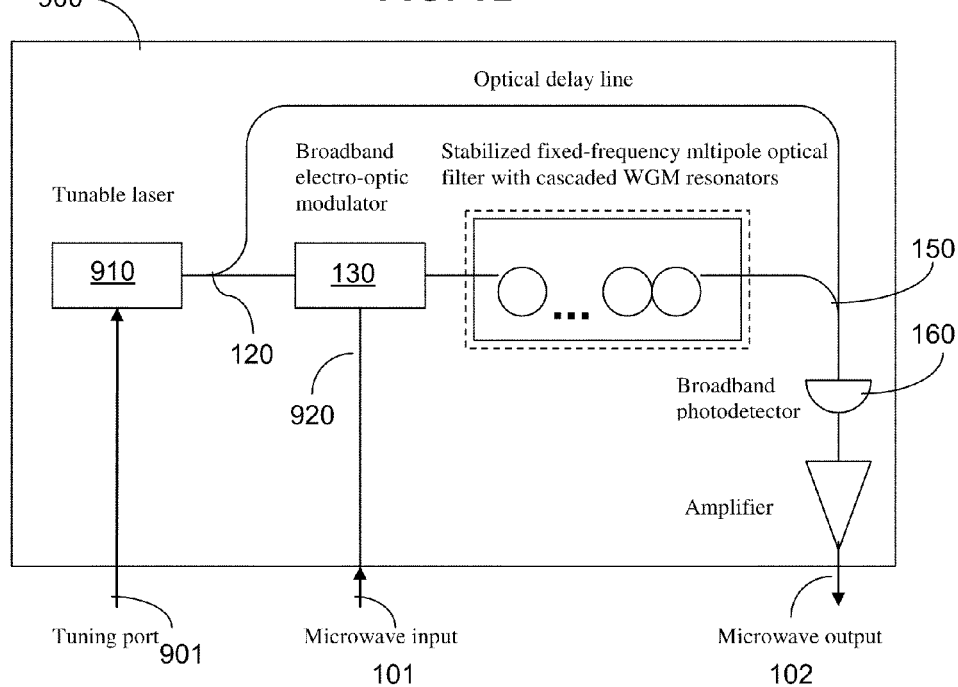

FIGS. 11 and 12 show two examples of tunable RF or microwave filters based on the design in FIG. 9. In the filter 1100 in FIG. 11, a Fabry-Perot resonator filter 1110 is used as the filter 920 in FIG. 9. The filter 1200 in FIG. 12 uses a multi-pole filter with cascaded WGM microresonators as the filter 920 in FIG. 9. The multi-pole filter may be formed by cascaded ring resonators, microsphere resonators, or toroidal resonators that support whispering-gallery modes. The filters described in FIGS. 5A through 8B may also be used as the filter 920.

This use of the tunable laser 910 for tuning the frequency of the filtered RF or microwave signal 102 can simplify the construction of the optical filter 920 because a fixed filter can be used as the filter 920 without the frequency tuning mechanism. Tunable multi-pole optical filters can be complex because changes in the multi-pole variants are to be synchronized during the tuning in order to maintain the desired multi-pole filter function. One or more resonators used in the fixed filter 920 may still be tunable filters to allow for tuning of individual resonators by the electro-optic or other effects to set the desired offsets of resonance frequencies so that a desired initial spectral profile of the filter passband can be achieved. Alternatively, UV-sensitive materials may also be used to form the resonators for the filter 920 so that UV trimming can be used to modify the refractive indices of the resonators and thus control the resonance frequencies of the resonators by exposing the resonators to UV light. After the initial filter profile is set, the optical filter 920 may be stabilized. The RF filter tuning is then achieved by tuning the laser frequency.

Agile frequency tuning in lasers, such as diode lasers and diode-based lasers, is well developed and can be implemented by different methods. For example, the driving current in distributed feedback (DFB) semiconductor lasers can be changed to tune the laser frequencies. Typical range of frequency tuning in some DFB lasers in the communication band 1550 nm is about 60-80 GHz, with an optical laser linewidth of about 1 MHz. Such tunable lasers are suitable for use in tunable RF or microwave filters with a tunable transmission passband of about 20 MHz and more.

Only a few implementations are disclosed. However, it is understood that variations and enhancements may be made.

What is claimed is what is described and illustrated, including:

1. A device, comprising:
   an input port to receive an input microwave or RF signal;
   a tunable laser to produce a continuous-wave laser beam and to tune a laser frequency of the laser beam;
   a first optical path to receive a first portion of the laser beam;
   a second optical path to receive a second portion of the laser beam, the second optical path comprising:
   an optical modulator to modulate the second portion in response to the input signal to produce a modulated optical beam that carries the input signal, and
   an optical filter to filter the modulated optical beam to select at least one spectral component in the input signal while rejecting other spectral components and to output a filtered modulated optical beam that carries the at least one selected spectral component;
   a tuning control unit to tune the laser frequency of the tunable laser to change a frequency of the at least one selected spectral component; and
   an optical detector to combine the first portion from the first optical path and the filtered modulated optical beam from the second optical path and to produce a filtered output signal comprising the at least one selected spectral component.

2. The device as in claim 1, wherein the optical filter comprises a fixed-frequency optical filter.

3. The device as in claim 1, wherein the optical fiber comprises a Fabry-Perot resonator filter.

4. The device as in claim 1, wherein the optical filter comprises at least two cascaded optical resonators.

5. The device as in claim 4, wherein the optical resonators comprise whispering gallery mode resonators.

6. The device as in claim 4, wherein the whispering gallery mode resonators are microsphere resonators.

7. The device as in claim 4, wherein the whispering gallery mode resonators are toroidal resonators.

8. The device as in claim 4, wherein the optical resonators are ring resonators that have whispering gallery modes.

9. The device as in claim 1, wherein the optical resonators exhibit an electro-optic effect.

10. The device as in claim 1, wherein the optical filter is tunable in frequency.

* * * * *

UNITED STATES PATENT AND TRADEMARK OFFICE
CERTIFICATE OF CORRECTION

PATENT NO. : 7,813,651 B2  Page 1 of 2
APPLICATION NO. : 12/555790
DATED : October 12, 2010
INVENTOR(S) : Vladimir Ilchenko and Lutfollah Maleki It is certified that error appears in the above-identified patent and that said Letters Patent is hereby corrected as shown below:

On the Title Page

On Page 2, Item (56) under "OTHER PUBLICATIONS", Line 3, please delete "Sympsoium" and insert -- Symposium --, therefor.

On Page 3, Item (56) under "OTHER PUBLICATIONS", in Column 2, Lines 6-7, please delete "Tecnhology," and insert -- Technology, --, therefor.

In Figure 3B, Sheet 3 of 12, please delete "Single-Plole" and insert -- Single-Pole --, therefor.

In Figure 12, Sheet 12 of 12, please delete "mltipole" and insert -- multipole --, therefor.

In Column 3, Line 45, in Heading, please delete "OF" and insert -- OF THE --, therefor.

In Column 6, Line 17, please delete "filterted" and insert -- filtered --, therefor.

In Column 10, Line 7, please delete "spheriodal" and insert -- spheroidal --, therefor.

In Column 11, Line 46, please delete "($\omega_1+\omega_2$)/2)" and insert -- ($\omega_1+\omega_2$) --, therefor.

In Column 11, Lines 49-51, in Equation, please delete " $|T_P|^2_{max} =$ " and insert -- $|T_P|^2_{max} \simeq$ --, therefor.

In Column 11, Lines 64-65, in Equation, please delete " $\Gamma =$ " and insert -- $\Gamma \simeq$ --, therefor.

Signed and Sealed this
Twenty-third Day of August, 2011

David J. Kappos
*Director of the United States Patent and Trademark Office*

CERTIFICATE OF CORRECTION (continued)
U.S. Pat. No. 7,813,651 B2

In Column 14, Line 15, please delete "$\omega_o.$" and insert -- $\omega_0.$ --, therefor.